United States Patent
Adams et al.

(10) Patent No.: US 7,783,943 B2
(45) Date of Patent: Aug. 24, 2010

(54) METHOD AND APPARATUS FOR TESTING A RANDOM ACCESS MEMORY DEVICE

(75) Inventors: Chad Allen Adams, Byron, MN (US); Elizabeth Lair Gerhard, Rochester, MN (US); Sharon Huertas Cesky, Rochester, MN (US); Jeffrey Milton Scherer, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 274 days.

(21) Appl. No.: 12/121,512

(22) Filed: May 15, 2008

(65) Prior Publication Data

US 2009/0287971 A1 Nov. 19, 2009

(51) Int. Cl.
*G11C 29/00* (2006.01)
(52) U.S. Cl. .................. 714/718; 714/733; 365/201
(58) Field of Classification Search ............... 365/207, 365/156, 201; 714/718, 733, 719, 735
See application file for complete search history.

(56) References Cited

U.S. PATENT DOCUMENTS

| | | | |
|---|---|---|---|
| 5,923,676 A | 7/1999 | Sunter et al. | |
| 5,996,097 A | 11/1999 | Evans et al. | |
| 6,118,717 A * | 9/2000 | Brady | 365/207 |
| 6,452,866 B2 * | 9/2002 | McLaury | 365/233.16 |
| 6,493,257 B1 * | 12/2002 | Coughlin et al. | 365/156 |
| 6,990,038 B1 | 1/2006 | Chan et al. | |
| 7,102,946 B2 * | 9/2006 | Pelella | 365/205 |
| 7,113,433 B2 * | 9/2006 | Chan et al. | 365/190 |
| 2001/0046175 A1 | 11/2001 | Bosshart | |
| 2009/0271669 A1 * | 10/2009 | Adams et al. | 714/718 |

* cited by examiner

*Primary Examiner*—David Ton
(74) *Attorney, Agent, or Firm*—Kenneth L. Sherman, Esq.; Michael Zarrabian, Esq.; Myers Andras Sherman LLP

(57) ABSTRACT

A method and apparatus for testing a random access memory device is provided. One embodiment involves providing an interface between Logic Built in Self Test (LBIST) and Array Built in Self Test (ABIST) paths for memory testing, including providing a cross-coupled NAND device with an LBIST test path; configuring the cross-coupled NAND device for interfacing ABIST and LBIST paths by modeling a worst case scenario for timing from a domino read static random access memory (SRAM) array; and modifying data in the cross-coupled NAND device using an LBIST controlled data path at essentially the latest point in time when a read may propagate from the array to provide full AC test coverage of down stream logic.

1 Claim, 3 Drawing Sheets

METHOD AND APPARATUS FOR TESTING A RANDOM ACCESS MEMORY DEVICE

BACKGROUND OF THE INVENTION

1. Field of the Invention

The present invention relates generally to memory device testing and in particular to AC testability path for memory devices.

2. Background Information

AC testability is an important part of memory chip verification. Standard chip verification (or bring up) involves running various patterns on LBIST (Logic Built in Self Test) and ABIST (Array Built in Self Test) paths. Ideally, LBIST and ABIST paths should be mutually exclusive and have no interaction with each other. However, this is very rarely achieved in practice and in most cases LBIST paths are dependent on the timing and behavior of a memory array which is typically tested by ABIST.

SUMMARY OF THE INVENTION

A method and apparatus for testing a random access memory device is provided. One embodiment involves providing an interface between Logic Built in Self Test (LBIST) and Array Built in Self Test (ABIST) paths for memory testing, including providing a cross-coupled flash memory such as a NAND device with an LBIST test path; configuring the cross-coupled NAND device for interfacing ABIST and LBIST paths by modeling a worst case scenario for timing from a domino read static random access memory (SRAM) array; and modifying data in the cross-coupled NAND device using an LBIST controlled data path at essentially the latest point in time when a read may propagate from the array to provide full AC test coverage of down stream logic.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the invention, as well as a preferred mode of use, reference should be made to the following detailed description read in conjunction with the accompanying drawings, in which.

DESCRIPTION OF THE PREFERRED EMBODIMENTS

The following description is made for the purpose of illustrating the general principles of the invention and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

A method and apparatus for testing a random access memory device is provided. One embodiment involves providing an interface between Logic Built in Self Test (LBIST) and Array Built in Self Test (ABIST) paths for memory testing, including providing a cross-coupled NAND device with an LBIST test path; configuring the cross-coupled NAND device for interfacing ABIST and LBIST paths by modeling a worst case scenario for timing from a domino read static random access memory (SRAM) array; and modifying data in the cross-coupled NAND device using an LBIST controlled data path at essentially the latest point in time when a read may propagate from the array to provide full AC test coverage of down stream logic.

An example implementation comprises a cross-coupled NAND circuit with AC testability path for memory devices. The circuit functions as an interface between LBIST and ABIST paths, providing an interface between LBIST and ABIST test domains that improve memory chip manufacturing and quality. An example cross-coupled NAND structure with an LBIST test path that models a worst case scenario for the timing from a domino read SRAM is described below. The circuit allows realistic testing of combined ABIST and LBIST paths by modeling a worst case read from a domino read SRAM, which is important since domino read SRAM have variable access times. The invention models a worst case read by modifying the data in the cross coupled NAND device through an LBIST controlled data path at the latest point in time where a read may actually propagate out of the SPAM memory array. By performing the modification in the cross-coupled NAND, it is possible to propagate realistic timing to down stream logic during LBIST to provide full AC test coverage.

Figure 1:
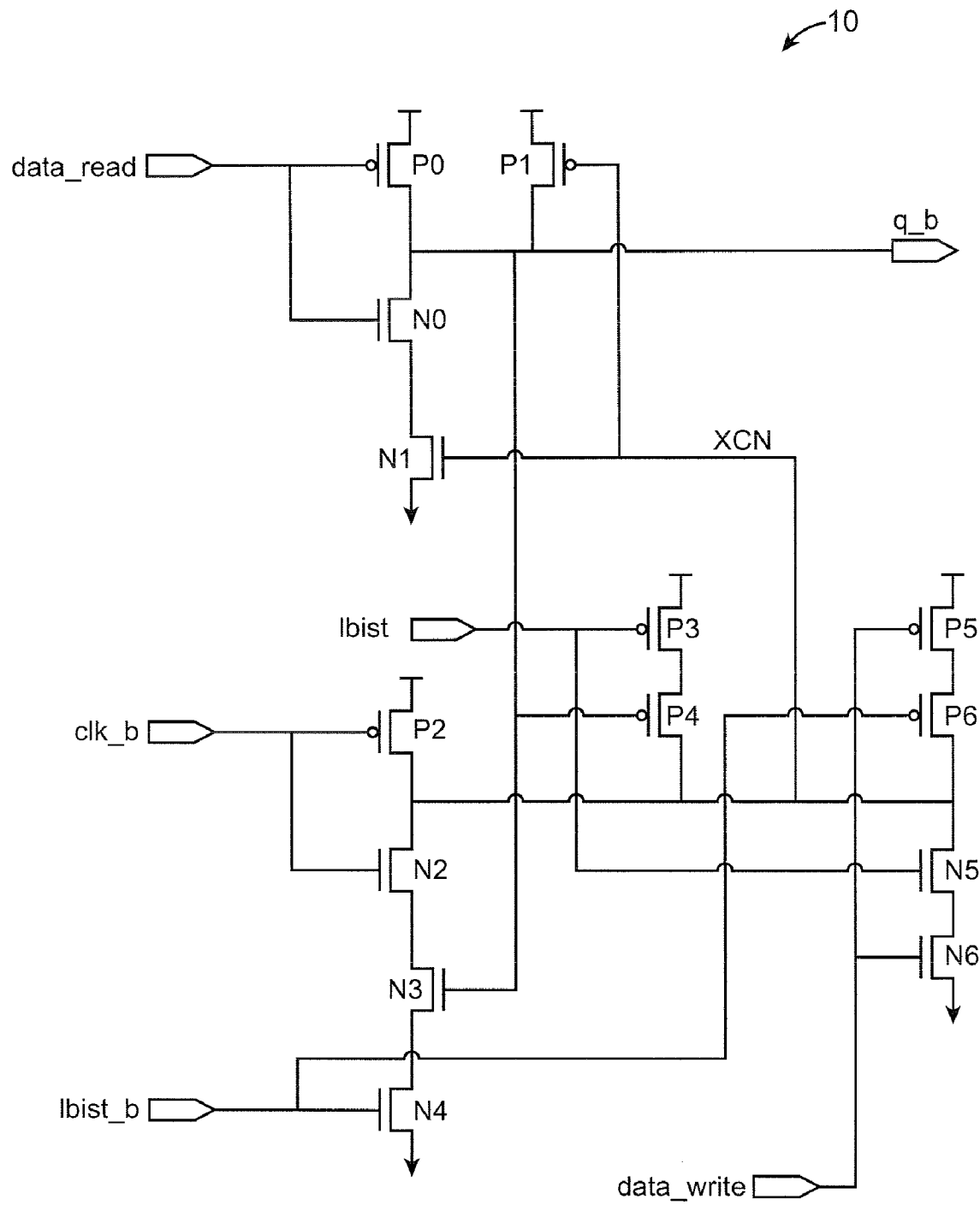
FIG. 1 shows an example schematic of a cross-coupled NAND circuit for memory testing, according to the invention.
Figure 2:
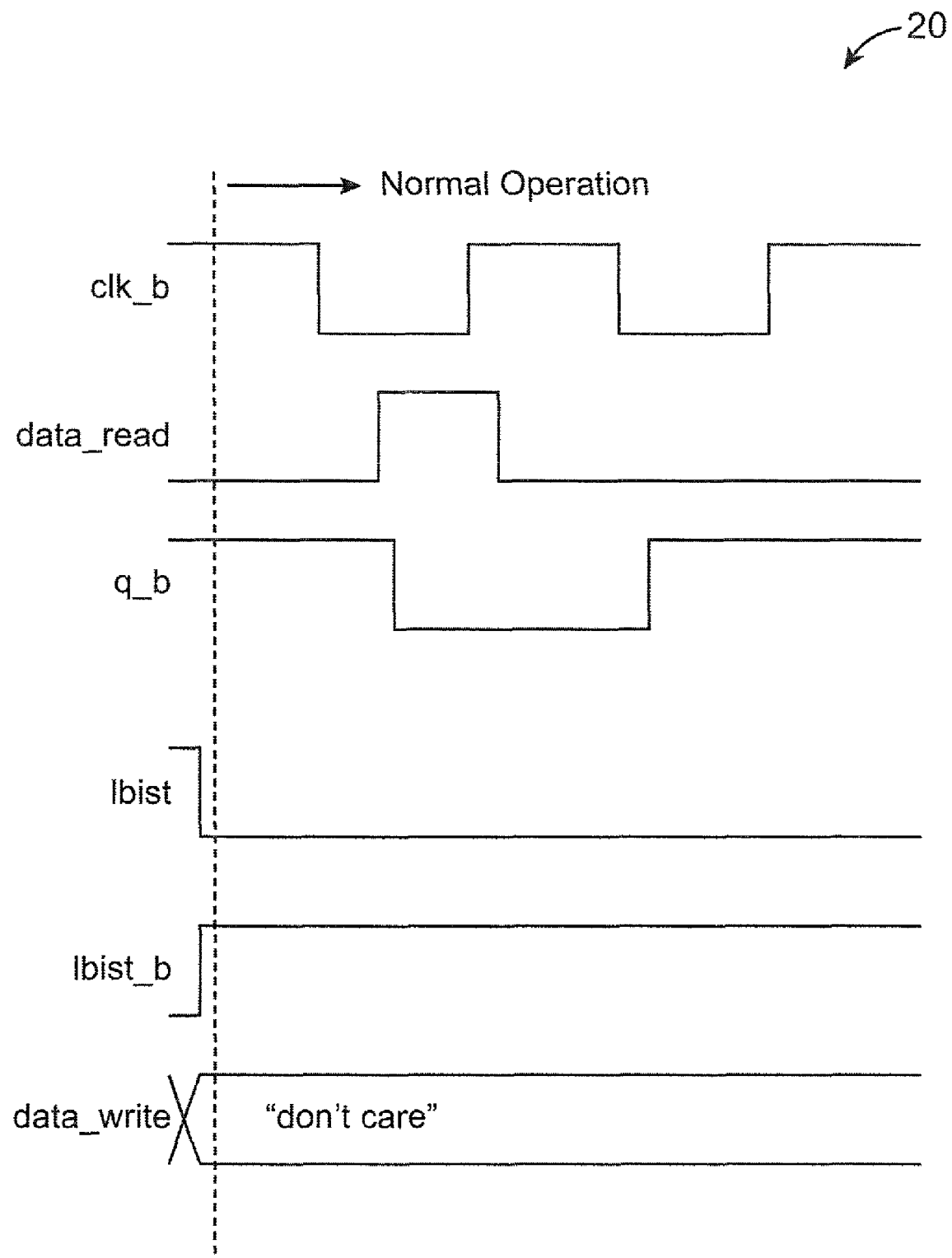
FIG. 2 shows example waveforms of the cross-coupled NAND circuit in normal functional operation.

FIG. 1 shows an example schematic of a cross-coupled NAND circuit 10 according to the invention. The circuit includes n-channel MOSFETs N0-N6 and p-channel MOSFETs P0-P6 interconnected to form a cross-coupled NAND circuit as shown. In normal function (operating as a conventional cross-coupled NAND circuit), as shown by example waveforms 20 in FIG. 2, lbist input is held low and lbist_b is held high. This disables N5, N6, P5, and P6 device stacks and allows the gate defined by N2-N4 and P2-P4 to operate as a normal NAND gate, and therefore the circuit operates as a dynamic to static converter (cross-coupled NAND).

Figure 3:
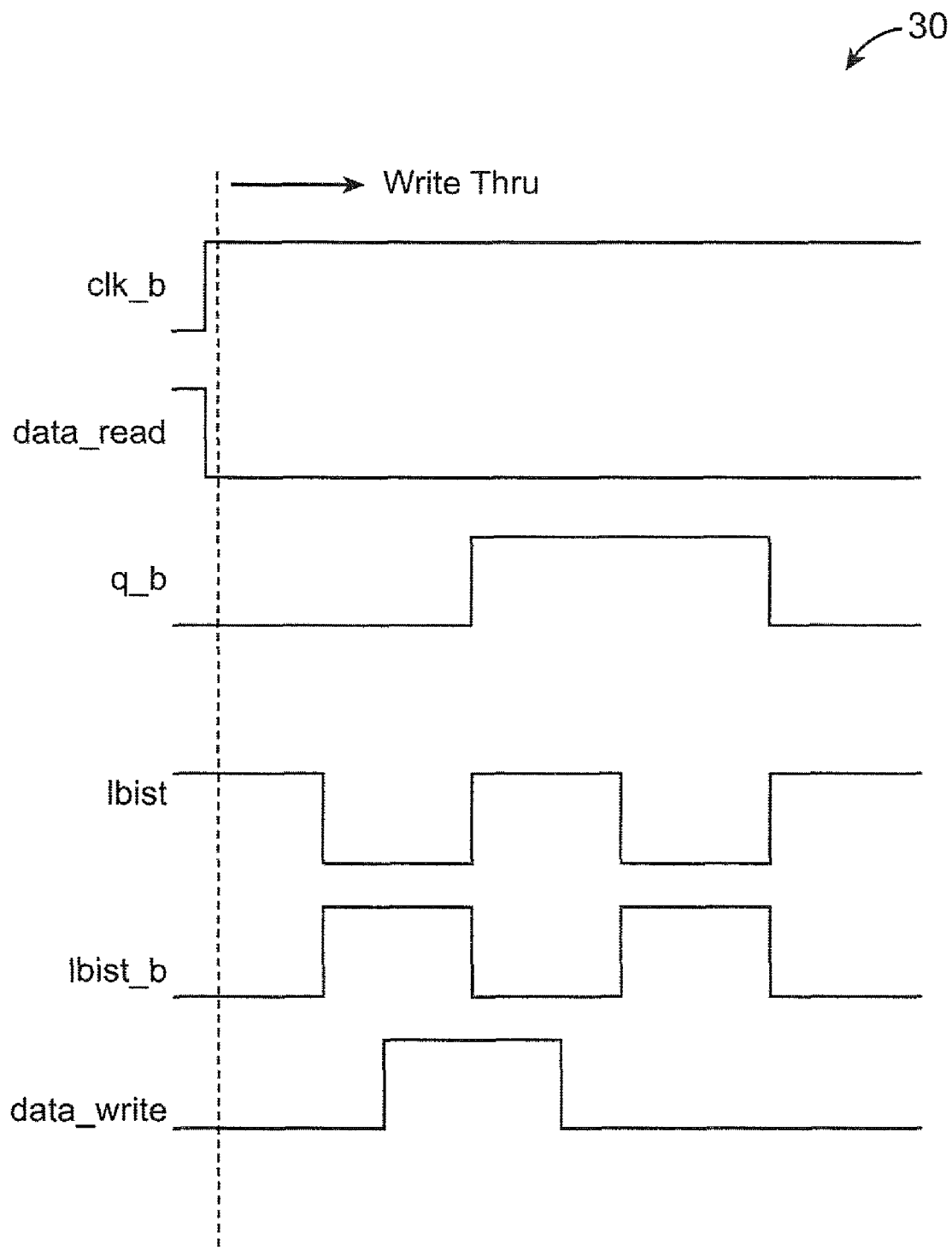
FIG. 3 shows another example waveform of the cross-coupled NAND circuit, according to the invention when in new LBIST test mode.

FIG. 3 shows example waveform 30 for the cross-coupled NAND circuit 10 during test, wherein in this mode of operation clk_b is held high and data_read is held low, which is the normal inactive state of the memory. The AC test path is activated by clocking lbist and the inverted version lbist_b. In this mode of operation, when lbist goes high the value of data_write is latched onto q_b in order to test the down stream logic. Using this configuration the data_write is passed onto q_b with similar timing as the latest possible arrival of data_read that would still have made it to the output in normal function. This feature mimics the slowest read path of the memory and therefore provides realistic timing for down stream logic during logic built in self test (LBIST). This method also reduces LBIST power by not requiring the memory to be active during this mode.

As is known to those skilled in the art, the aforementioned example embodiments described above, according to the present invention, can be implemented in many ways, such as program instructions for execution by a processor, as software modules, as computer program product on computer readable media, as logic circuits, as silicon wafers, as integrated circuits, as application specific integrated circuits, as firmware, etc. Though the present invention has been described with reference to certain versions thereof; however, other versions are possible. Therefore, the spirit and scope of the appended claims should not be limited to the description of the preferred versions contained herein.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A method of testing a random access memory device, comprising:

providing an interface between Logic Built in Self Test (LBIST) and Array Built in Self Test (ABIST) paths for memory testing, including providing a cross-coupled NAND device with an LBIST path;

configuring the cross-coupled NAND device for interfacing ABIST and LBIST paths by modeling a worst case scenario for timing from a domino read static random access memory (SRAM) array; and modifying data in the cross-coupled NAND device using an LBIST controlled data path at essentially the latest point in time when a read may propagate from the array to provide full AC test coverage of down stream logic.

* * * * *